(12) United States Patent
Jou et al.

(10) Patent No.: US 11,545,481 B2
(45) Date of Patent: Jan. 3, 2023

(54) ELECTROSTATIC DISCHARGE PROTECTION DEVICES

(71) Applicant: Vanguard International Semiconductor Corporation, Hsinchu (TW)

(72) Inventors: Yeh-Ning Jou, Hsinchu (TW); Hsien-Feng Liao, Taichung (TW); Jia-Rong Yeh, Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 679 days.

(21) Appl. No.: 16/372,839

(22) Filed: Apr. 2, 2019

(65) Prior Publication Data

US 2020/0321328 A1    Oct. 8, 2020

(51) Int. Cl.
*H01L 27/02* (2006.01)
*H02H 9/04* (2006.01)

(52) U.S. Cl.
CPC ......... *H01L 27/0248* (2013.01); *H02H 9/046* (2013.01)

(58) Field of Classification Search
CPC ......... H01L 23/58; H01L 23/60; H01L 23/62; H01L 27/0203; H01L 27/0248–0296; H01L 27/0259; H02H 9/00; H02H 9/04–06; H02H 9/046
USPC .......................................................... 361/56
See application file for complete search history.

(56) References Cited

U.S. PATENT DOCUMENTS

| | | | | |
|---|---|---|---|---|
| 8,368,116 | B2* | 2/2013 | Salcedo | H01L 27/0259 257/173 |
| 8,432,651 | B2* | 4/2013 | Salcedo | H01L 27/06 361/56 |
| 2002/0001229 | A1* | 1/2002 | Takahashi | G11C 16/30 365/185.25 |
| 2002/0171110 | A1* | 11/2002 | Tang | H01L 27/0255 257/355 |
| 2003/0047787 | A1 | 3/2003 | Cheng et al. | |
| 2004/0016992 | A1* | 1/2004 | Mallikarjunaswamy | H01L 29/87 257/546 |
| 2004/0240128 | A1 | 12/2004 | Boselli et al. | |
| 2005/0012155 | A1* | 1/2005 | Ker | H01L 27/0266 257/355 |

(Continued)

OTHER PUBLICATIONS

Taiwanese Office Action for Taiwanese Application No. 107146033, dated Oct. 7, 2019.

(Continued)

*Primary Examiner* — Kevin J Comber
(74) *Attorney, Agent, or Firm* — Birch, Stewart, Kolasch & Birch, LLP (57) ABSTRACT

An electrostatic discharge protection device includes a first well region, a second well region, a first doped region, and a first heavily doped region. The first well region and the second well region are disposed in a semiconductor substrate. The first doped region is disposed in the first well region and the second well region. The first heavily doped region is disposed in the first doped region in the first well region. The first well region and the first doped region have a first conductivity type, and the second well region and the first heavily doped region have a second conductivity type that is the opposite of the first conductivity type.

18 Claims, 8 Drawing Sheets

(56) References Cited

U.S. PATENT DOCUMENTS

| | | |
|---|---|---|
| 2006/0033163 A1 | 2/2006 | Chen |
| 2006/0097321 A1* | 5/2006 | Kim ................... H01L 27/0262 257/355 |
| 2006/0255411 A1 | 11/2006 | Suzuki et al. |
| 2006/0258067 A1* | 11/2006 | Jeon ...................... H01L 29/87 438/154 |
| 2007/0034897 A1* | 2/2007 | Kim ................... H01L 29/0626 257/173 |
| 2007/0131965 A1* | 6/2007 | Kim ................... H01L 29/7436 257/173 |
| 2008/0179681 A1 | 7/2008 | Kwak |
| 2008/0253046 A1* | 10/2008 | Lou ......................... H01L 29/87 361/56 |
| 2010/0109083 A1* | 5/2010 | Kim ................... H01L 27/0921 257/337 |
| 2010/0327342 A1* | 12/2010 | Salcedo ................. H01L 29/87 257/328 |
| 2011/0303944 A1* | 12/2011 | Arndt ................... H01L 33/486 257/99 |
| 2011/0303947 A1* | 12/2011 | Salcedo ............. H01L 27/0259 257/173 |
| 2012/0168906 A1* | 7/2012 | Kuo ................... H01L 27/0259 257/557 |
| 2013/0020645 A1 | 1/2013 | Campi, Jr. et al. |
| 2013/0207179 A1 | 8/2013 | Lai et al. |
| 2015/0187749 A1* | 7/2015 | Dai ................... H01L 29/66121 257/173 |
| 2016/0225757 A1 | 8/2016 | Gan |
| 2017/0062406 A1* | 3/2017 | Ko ..................... H01L 29/0649 |
| 2017/0358568 A1* | 12/2017 | Edwards ............. H01L 27/0262 |

OTHER PUBLICATIONS

Taiwanese Office Action and Search Report, dated Jul. 11, 2019, for Taiwanese Application No. 107146033.

Zhou et al., "Modeling of High Voltage Devices for ESD Event Simulation in SPICE," NSTI-Nanotech 2011, vol. 2, 2011, pp. 747-750.

* cited by examiner

FIG. 8A

ELECTROSTATIC DISCHARGE PROTECTION DEVICES

BACKGROUND

Technical Field

The disclosure relates to electrostatic discharge protection devices, and more particularly, to the electrostatic discharge protection devices with low on-state resistance.

Description of the Related Art

As semiconductor manufacturing processes have developed, electrostatic discharge (ESD) protection has become one of the most critical reliability issues for integrated circuits (IC). Electrostatic discharge protection circuits generally protect integrated circuits (IC) from machine model (MM) or human body model (HBM) electrostatic discharge events. Commercial integrated circuits require high tolerance to accidental ESD and the dangers this can cause. Otherwise, the IC can easily become damaged by an accidental ESD event. Therefore, designers always research how to design ESD protection elements to effectively protect ICs.

SUMMARY

Some embodiments of the present disclosure provide an electrostatic discharge protection device. The electrostatic discharge protection device includes a first well region and a second well region disposed in a semiconductor substrate. The first well region has a first conductivity type, and the second well region has a second conductivity type that is the opposite of the first conductivity type. The electrostatic discharge protection device also includes a first doped region disposed in the first well region and the second well region. The first doped region has the first conductivity type. The electrostatic discharge protection device also includes a first heavily doped region disposed in the first doped region in the first well region. The first heavily doped region has the second conductivity type.

Some embodiments of the present disclosure provide an electrostatic discharge protection device. The electrostatic discharge protection device includes a first well region disposed in a semiconductor substrate. The electrostatic discharge protection device also includes a first doped region including a first portion in the first well region and a second portion outside the first well region. The electrostatic discharge protection device also includes a first heavily doped region disposed in the second portion of the first doped region. The electrostatic discharge protection device also includes a second heavily doped region disposed in the second well region. The first doped region has a first conductivity type, and the first well region, the first heavily doped region, and the second heavily doped region have a second conductivity type that is the opposite of the first conductivity type.

In order to make features and advantages of the present disclosure easy to understand, a detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The embodiments of the present disclosure are related to an electrostatic discharge protection device. The electrostatic discharge protection device includes a parasitic bipolar junction transistor (BJT) which is formed from a heavily doped region, a moderately doped region, and a lightly doped well region. When an electrostatic discharge event occurs, the PN junction between the well region and the moderately doped region is broken down at a low voltage to generate a reverse current so that the electrostatic current is discharged through the BJT of the electrostatic discharge protection device without through semiconductor devices protected by the electrostatic discharge protection device. Therefore, the electrostatic discharge protection device protects the semiconductor devices from damage in the event of an electrostatic discharge.

Figure 1A:
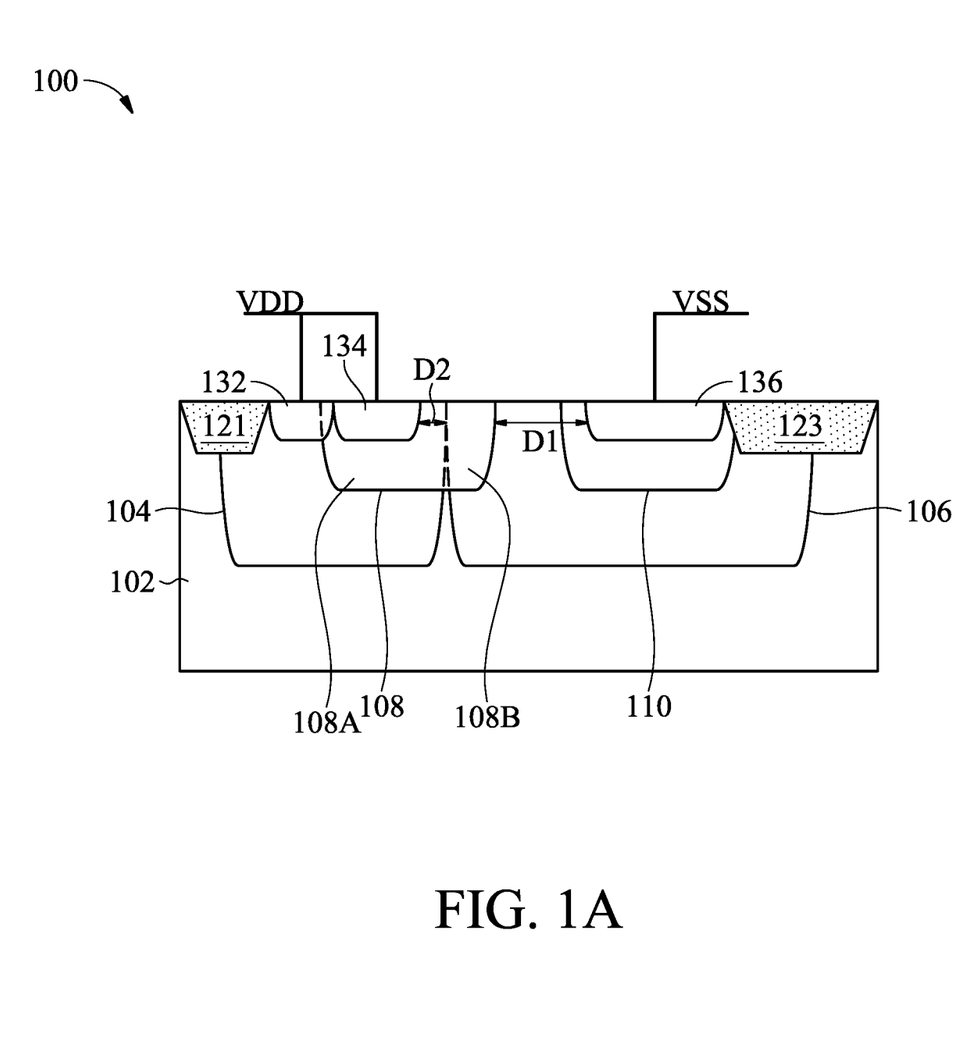
FIG. 1A illustrates a cross-sectional view of an electrostatic discharge protection device in accordance with some embodiments of the present disclosure.
Figure 1B:
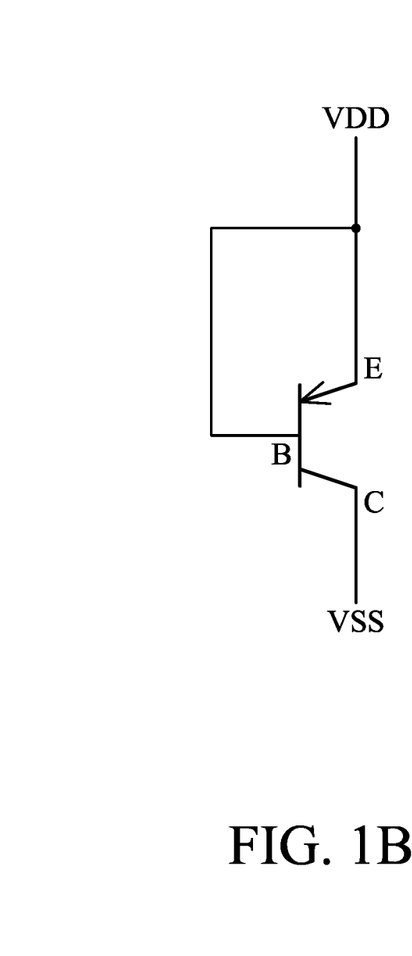
FIG. 1B illustrates an equivalent circuit diagram of the electrostatic discharge protection device of FIG. 1A.

FIG. 1A illustrates a cross-sectional view of an electrostatic discharge protection device 100 in accordance with some embodiments of the present disclosure, and FIG. 1B illustrates an equivalent circuit diagram of the electrostatic discharge protection device 100 device of FIG. 1A.

The electrostatic discharge protection device 100 includes a semiconductor substrate 102, as shown in FIG. 1A, in accordance with some embodiments. The semiconductor substrate 102 includes an elementary semiconductor such as silicon (Si) substrate, in accordance with some embodiments. In some embodiments, the semiconductor substrate 102 includes an elementary semiconductor such as germanium (Ge); a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof.

The semiconductor substrate 102 is doped to have a first conductivity type or a second conductivity type that is the opposite of the first conductivity type, in accordance with some embodiments. The first conductivity type is N-type and the second conductivity type is P-type, in accordance with some embodiments. In some embodiments, the semiconductor substrate 102 has the first conductivity type (such as N-type), for example, the semiconductor substrate 102 may be doped with phosphorous (P) or arsenic (As). In some embodiment, the semiconductor substrate 102 has the second conductivity type (such as P-type), for example, the semiconductor substrate 102 may be doped with boron (B).

In addition to the electrostatic discharge protection device 100, other semiconductor devices (not shown), such as active elements, passive elements (such as resistor or capacitor), or a combination thereof, are formed on the semiconductor substrate 102, in accordance with some embodiments. In some embodiments, the active elements include transistors, metal oxide semiconductor field effect transistors (MOSFETs), metal insulator semiconductor FET (MISFETs), junction field effect transistors (JFETs), insulated gate bipolar transistors (IGBTs), or combinations thereof. The electrostatic discharge protection device 100 protects the semiconductor devices from damage in electrostatic discharge events.

The electrostatic discharge protection device 100 includes a first well region 104 and a second well region 106, as shown in FIG. 1A, in accordance with some embodiments. The first well region 104 and the second well region 106 are disposed in the semiconductor substrate 102, in accordance with some embodiments. The first well region 104 and the second well region 106 extend downwardly from the upper surface of the semiconductor substrate 102, in accordance with some embodiments. The first well region 104 is in contact with the second well region 106, in accordance with some embodiments.

The first well region 104 has a different conductivity type than the second well region 106, in accordance with some embodiments. The first well region 104 has the first conductivity type (such as N-type), and the second well region 106 has the second conductivity type (such as P-type), in accordance with some embodiments. In some embodiments, the first conductivity type is N-type dopant such as phosphorus (P), arsenic (As), nitrogen (N), antimony (Sb), or a combination thereof. In some embodiments, the second conductivity type is P-type dopant such as boron (B), gallium (Ga), aluminum (Al), indium (In), or a combination thereof. In some embodiments, the first well region 104 and the second well region 106 are formed by respective ion implantation processes.

The electrostatic discharge protection device 100 includes a first doped region 108, as shown in FIG. 1A, in accordance with some embodiments. The first doped region 108 has a first portion 108A disposed in the first well region 104 and a second portion 108B disposed in the second well region 106, in accordance with some embodiments. The boundary between the first well region 104 and the second well region 106 passes through the first doped region 108, in accordance with some embodiments. The first doped region 108 extends downwardly from the upper surface of the semiconductor substrate 102, in accordance with some embodiments.

The first doped region 108 has the first conductivity type (such as N-type), in accordance with some embodiments. The first doped region 108 has a doping concentration that is greater than the dopant concentration of the first well region 104, in accordance with some embodiments. The first doped region 108 has a doping concentration that is greater than the dopant concentration of the second well region 106, in accordance with some embodiments. In some embodiments, the first doped region 108 is formed by an ion implantation process.

The electrostatic discharge protection device 100 includes a second doped region 110, as shown in FIG. 1A, in accordance with some embodiments. The second doped region 110 is disposed in the second well region 106, in accordance with some embodiments. The second doped region 110 extends downwardly from the upper surface of the semiconductor substrate 102, in accordance with some embodiments.

The second doped region 110 has the second conductivity type (such as P-type), in accordance with some embodiments. The second doped region 110 has a doping concentration that is greater than the doping concentration of the second well region 106, in accordance with some embodiments. In some embodiments, the second doped region 110 is formed by an ion implantation process.

The electrostatic discharge protection device 100 includes a first heavily doped region 132, as shown in FIG. 1A, in accordance with some embodiments. The first heavily doped region 132 provides an ohmic contact for an interconnect structure (not shown, such as contact plugs) formed thereon, in accordance with some embodiments. The first heavily doped region 132 is disposed in the first well region 104, in accordance with some embodiments. A portion of the first heavily doped region 132 is disposed in the first doped region 108, in accordance with some embodiments. The first heavily doped region 132 extends downwardly from the upper surface of the semiconductor substrate 102, in accordance with some embodiments.

The first heavily doped region 132 has the first conductivity type (such as N-type), in accordance with some embodiments. The doping concentration of the first heavily doped region 132 is greater than the doping concentration of the first well region 104 and doping concentration of the first doped region 108, in accordance with some embodiments. In some embodiments, the first heavily doped region 132 is formed by an ion implantation process.

The electrostatic discharge protection device 100 includes a second heavily doped region 134, as shown in FIG. 1A, in accordance with some embodiments. The second heavily doped region 134 provides an ohmic contact for the interconnect structure (not shown, such as contact plugs) formed thereon, in accordance with some embodiments. The second heavily doped region 134 is disposed in the first portion 108A of the first doped region 108, in accordance with some embodiments. The second heavily doped region 134 is entirely disposed in the first portion 108A of the first doped region 108, in accordance with some embodiments. The first heavily doped region 132 is in contact with the second heavily doped region 134, in accordance with some embodiments. The second heavily doped region 134 extends downwardly from the upper surface of the semiconductor substrate 102, in accordance with some embodiments.

The second heavily doped region 134 has the second conductivity type (such as P-type), in accordance with some embodiments. The doping concentration of the second heavily doped region 134 is greater than the doping concentration of the first doped region 108, in accordance with some embodiments. In some embodiments, the second heavily doped region 134 is formed by an ion implantation process.

The electrostatic discharge protection device 100 includes a third heavily doped region 136, as shown in FIG. 1A, in accordance with some embodiments. The third heavily doped region 136 provides an ohmic contact for the interconnect structure (not shown, such as contact plugs) formed thereon, in accordance with some embodiments. The third heavily doped region 136 is disposed in the second well region 106 outside the first doped region 108, in accordance with some embodiments. The third heavily doped region 136 is entirely disposed in the second doped region 110 in the second well region 106, in accordance with some embodiments. The third heavily doped region 136 extends downwardly from the upper surface of the semiconductor substrate 102, in accordance with some embodiments.

The third heavily doped region 136 has the second conductivity type (such as P-type), in accordance with some embodiments. The doping concentration of the third heavily doped region 136 is greater than the doping concentration of the second doped region 110. In some embodiments, the third heavily doped region 136 is formed by an ion implantation process.

The electrostatic discharge protection device 100 includes isolation features 121 and 123, as shown in FIG. 1A, in accordance with some embodiments. The isolation features 121 and 123 extend downwardly from the upper surface of the semiconductor substrate 102, in accordance with some embodiments.

The isolation features 121 and 123 are used to define the area in the semiconductor substrate 102 where the electrostatic discharge protection device 100 is formed, in accordance with some embodiments. The isolation feature 121 is disposed at a side of the first well region 104 away from the second well region 106, in accordance with some embodiments. The isolation feature 123 is disposed at a side of the second well region 106 away from the first well region 104, in accordance with some embodiments.

In some embodiments, the isolation features 121 and 123 include field oxide (FOX), local oxide of silicon (LOCOS), or shallow trench isolation (STI) structure. In some embodiments, the isolation features 121 and 123 are made of silicon oxide, silicon nitride, silicon oxynitride, another suitable dielectric material, or a combination thereof. In some embodiments, the isolation features 121 and 123 are formed by a thermal oxidation process. In some embodiments, the isolation features 121 and 123 are formed by an etching process and a deposition process.

The first heavily doped region 132 and the second heavily doped region 134 are together electrically connected to a power line VDD, as shown in FIG. 1A, in accordance with some embodiments. The third heavily doped region 136 is electrically connected to a ground line VSS, in accordance with some embodiments. The power line VDD and the ground line VSS respectively provide a high voltage and a low voltage to semiconductor devices that are protected by the electrostatic discharge protection device 100, in accordance with some embodiments.

In some embodiments, the interconnect structure is formed over the semiconductor substrate 102 so that the first heavily doped region 132 and the second heavily doped region 134 are electrically connected to the power line VDD and the third heavily doped region 136 is electrically connected to the ground line VSS. In some embodiments, the interconnect structure includes contact plugs which land on the first heavily doped region 132, the second heavily doped region 134, and the third heavily doped region 136. In some embodiments, the interconnect structure also includes conductive lines and vias formed over contact plugs.

A PN junction exists between the second heavily doped region 134 and the first doped region 108, and a PN junction exists between the second well region 106 and the first doped region 108, as shown in FIGS. 1A and 1B, in accordance with some embodiments. As a result, the second heavily doped region 134, the first doped region 108, and the second well region 106 form a parasitic bipolar junction transistor (BJT). The BJT is a PNP-type BJT, in accordance with some embodiments. The third heavily doped region 136 is a collector C of the BJT, the first doped region 108 is a base B of the BJT, the second heavily doped region 134 is an emitter E of the BJT, in accordance with some embodiments.

The PN junction between the second well region 106 and the first doped region 108 has a breakdown voltage that is lower than the operation voltage of the semiconductor devices protected by the electrostatic discharge protection device 100, in accordance with some embodiments. When an electrostatic discharge event occurs from the power line VDD, because the PN junction between the second well region 106 and the first doped region 108 is broken down at a low voltage, the electrostatic current is discharged through the BJT of the electrostatic discharge protection device 100 rather than through the semiconductor devices protected by the electrostatic discharge protection device 100. As a result, the electrostatic discharge protection device 100 protects the semiconductor devices from damage in the event of an electrostatic discharge.

Furthermore, once the PN junction between the second well region 106 and the first doped region 108 is broken down at a low voltage to generate a reverse current, the potential difference ($V_{EB}$) between the emitter E (the second heavily doped region 134) and the base B (the first doped region 108) generates a large amount of emitter current ($I_E$)

that flows to the collector C (the third heavily doped region 136), thereby reducing the on-resistance ($R_{ON}$) of the electrostatic discharge protection device 100. As a result, the electrostatic current can be rapidly discharged to the ground line VSS through the electrostatic discharge protection device 100.

Furthermore, the first doped region 108 is spaced apart from the third heavily doped region 136 by a distance D1, in accordance with some embodiments. If the distance D1 is too small, the breakdown voltage of the PN junction between the second well region 106 and the first doped region 108 may be low. If the distance D1 is too high, the on-resistance of the electrostatic discharge protection device 100 may increase. The second heavily doped region 134 in the first well region 104 is spaced apart from an edge of the first well region 104 by a distance D2, in accordance with some embodiments.

Furthermore, the on-resistance of the electrostatic discharge protection device 100 can be reduced further by forming the second doped region 110 in the second well region 106 so that the electrostatic current can be rapidly discharged to the ground line VSS through the electrostatic discharge protection device 100.

Figure 2A:
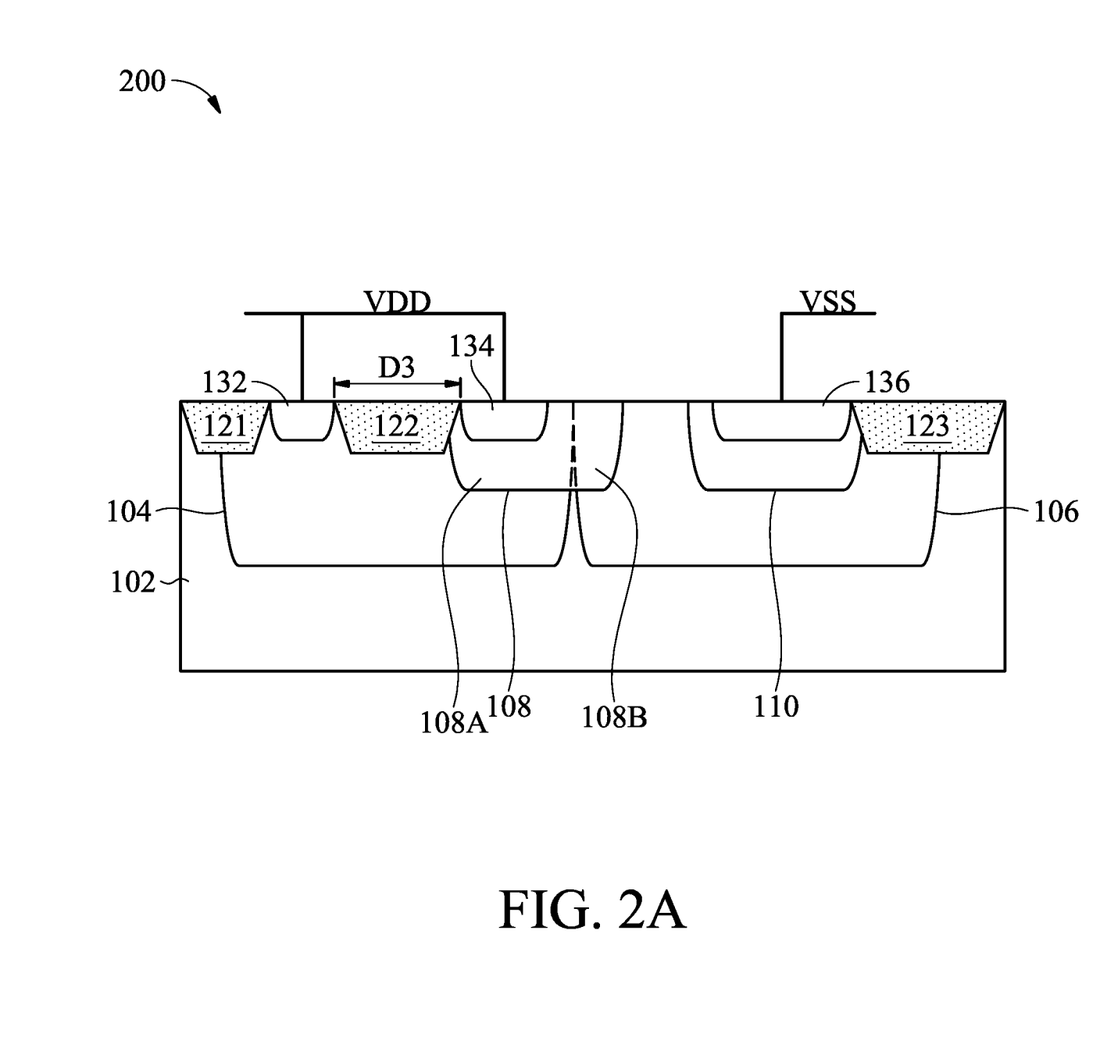
FIG. 2A illustrates a cross-sectional view of an electrostatic discharge protection device in accordance with some embodiments of the present disclosure.
Figure 2B:
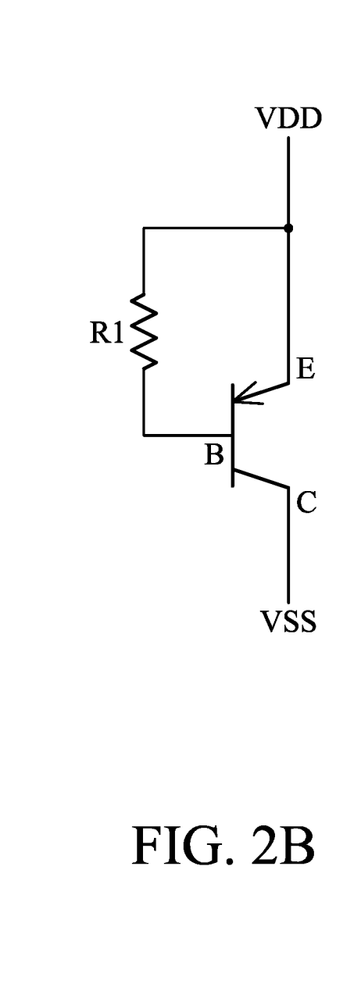
FIG. 2B illustrates an equivalent circuit diagram of the electrostatic discharge protection device of FIG. 2A.

FIG. 2A illustrates a cross-sectional view of an electrostatic discharge protection device 200 in accordance with some embodiments of the present disclosure, and FIG. 2B illustrates an equivalent circuit diagram of the electrostatic discharge protection device 200 of FIG. 2A. Elements or layers in FIGS. 2A and 2B that are the same or similar to those in FIGS. 1A and 1B are denoted by like reference numerals that have the same meaning, and the description thereof will not be repeated for the sake of brevity. The difference between the embodiments shown in FIGS. 2A-B and FIGS. 1A-B is that the electrostatic discharge protection device 200 includes an isolation feature 122.

The isolation feature 122 is disposed in the first well region 104, in accordance with some embodiments. The isolation feature 122 is disposed between the first heavily doped region 132 and the second heavily doped region 134, in accordance with some embodiments. The isolation feature 122 extends downwardly from the upper surface of the semiconductor substrate 102, in accordance with some embodiments. The isolation feature 122 is disposed in the first well region 104 outside the first doped region 108, in accordance with some embodiments. In some embodiments, the material and the formation method of the isolation feature 122 is the same as or similar to the isolation features 121 and 123 described above.

The first well region 104 provides a resistance R1 between the first heavily doped region 132 and the first doped region 108 (the base B) by forming the isolation feature 122, as shown in FIGS. 2A and 2B, in accordance with some embodiments. The resistance R1 can be adjusted by changing the dimension D3 of the isolation feature 122. For example, the larger dimension D3 results in the larger resistance R1 and vice versa. If the dimension D3 is too small, the resistance R1 does not increase significantly. If the dimension D3 is too large, the layout density of the semiconductor devices formed on the semiconductor substrate 102 is reduced.

Once the PN junction between the second well region 106 and the first doped region 108 is broken down at a low voltage to generate a reverse current, a potential difference ($V_{EB}$) exists between the emitter E (the second heavily doped region 134) and the base B (the first doped region 108). The larger resistance R1 results in the larger potential difference ($V_{EB}$) between the emitter E and the base B, which further increases the emitter current ($I_E$). As a result, the on-resistance of the electrostatic discharge protection device 200 can be reduced further by forming the isolation feature 122 so that the electrostatic current can be rapidly discharged to the ground line VSS through the electrostatic discharge protection device 200.

Figure 3A:
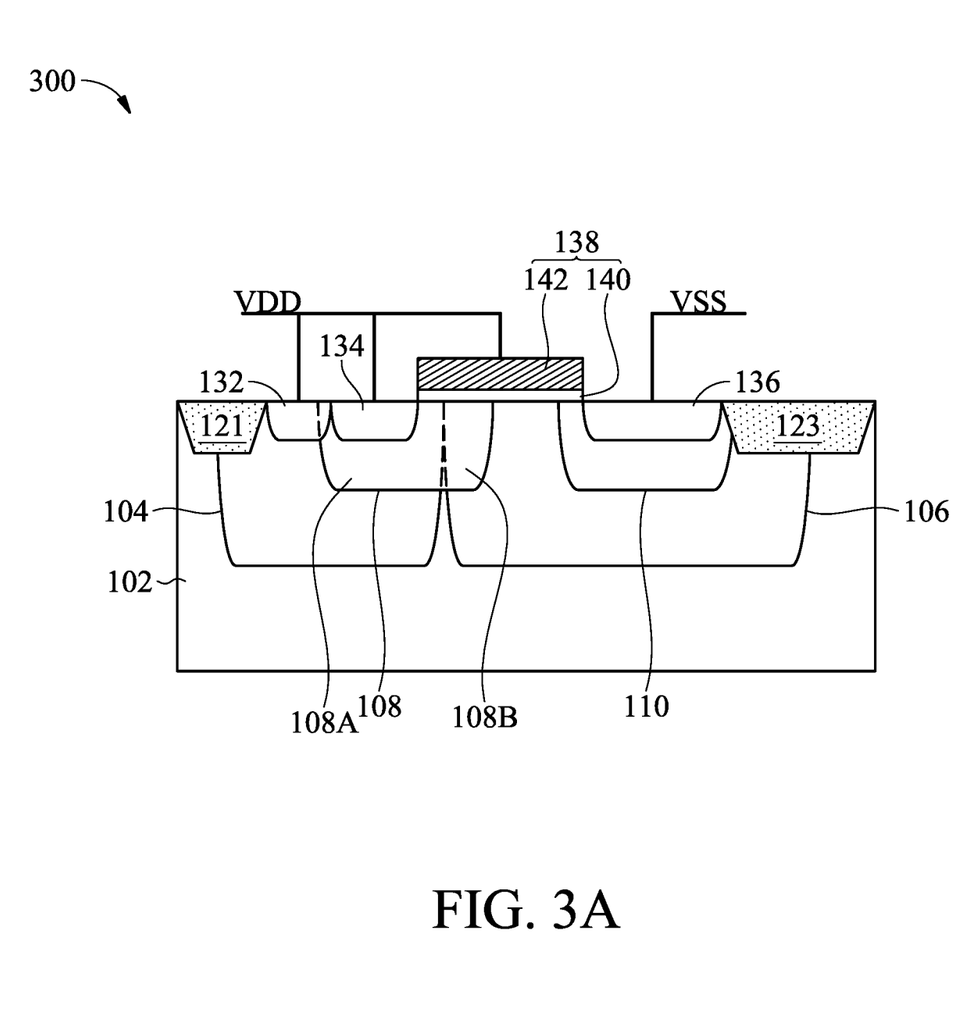
FIG. 3A illustrates a cross-sectional view of an electrostatic discharge protection device in accordance with some embodiments of the present disclosure.
Figure 3B:
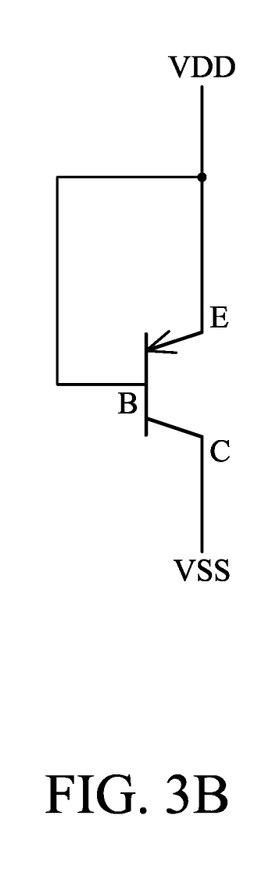
FIG. 3B illustrates an equivalent circuit diagram of the electrostatic discharge protection device of FIG. 3A.

FIG. 3A illustrates a cross-sectional view of an electrostatic discharge protection device 300 in accordance with some embodiments of the present disclosure, and FIG. 3B illustrates an equivalent circuit diagram of the electrostatic discharge protection device 300 of FIG. 3A. Elements or layers in FIGS. 3A and 3B that are the same or similar to those in FIGS. 1A and 1B are denoted by like reference numerals that have the same meaning, and the description thereof will not be repeated for the sake of brevity. The difference between the embodiments shown in FIGS. 3A-B and FIGS. 1A-B is that the electrostatic discharge protection device 300 includes a gate structure 138.

The gate structure 138 is disposed over the upper surface of the semiconductor substrate 102, in accordance with some embodiments. The gate structure 138 partially covers the first well region 104, the first doped region 108, the second well region 106, and the second doped region 110, in accordance with some embodiments. The gate structure 138 is disposed between the second heavily doped region 134 and the third heavily doped region 136, in accordance with some embodiments. The gate structure 138 does not cover the second heavily doped region 134 and the third heavily doped region 136, in accordance with some embodiments.

The first heavily doped region 132, the second heavily doped region 134, and the gate structure 138 are together electrically connected to the power line VDD, and the third heavily doped region 136 is electrically connected to a ground line VSS, in accordance with some embodiments.

The gate structure 138 includes a gate dielectric layer 140 and a gate electrode 142 formed over the gate dielectric layer 140, in accordance with some embodiments. In some embodiments, the gate dielectric layer 140 includes silicon oxide, silicon nitride, silicon oxynitride, or high-k (k value is greater than 3.9) dielectric material. In some embodiments, the high-k dielectric material includes LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $BaTiO_3$, $SrTiO_3$, $Al_2O_3$, another applicable high-k dielectric material, or a combination thereof. In some embodiments, the gate dielectric layer 142 is formed by an oxidation process (such as dry oxidation or wet oxidation), a deposition process (e.g., chemical vapor deposition (CVD) process, another applicable process, or a combination thereof.

In some embodiments, the gate electrode 142 includes a conductive material such as polysilicon or metal. In some embodiments, the polysilicon is doped. In some embodiments, the metal for gate electrode 142 includes tungsten (W), titanium (Ti), aluminum (Al), copper (Cu), molybdenum (Mo), nickel (Ni), platinum (Pt), the like, or a combination thereof. In some embodiments, the gate electrode 142 is formed by forming a conductive material by CVD process, a physical vapor deposition process (PVD), an electroplating process, an atomic layer deposition process (ALD), another applicable process, or a combination thereof. The electrode material is then patterned by a photolithography process and an etching process to form the gate electrode 142.

When an electrostatic discharge event occurs from the power line VDD, the gate structure 138 electrically connected to the power line VDD opens the channel region below the gate structure 138, which further increases the collector current ($I_C$). As a result, the on-resistance of the electrostatic discharge protection device 300 can be reduced further by forming the gate structure 138 so that the electrostatic current can be rapidly discharged to the ground line VSS through the electrostatic discharge protection device 300.

Figure 4A:
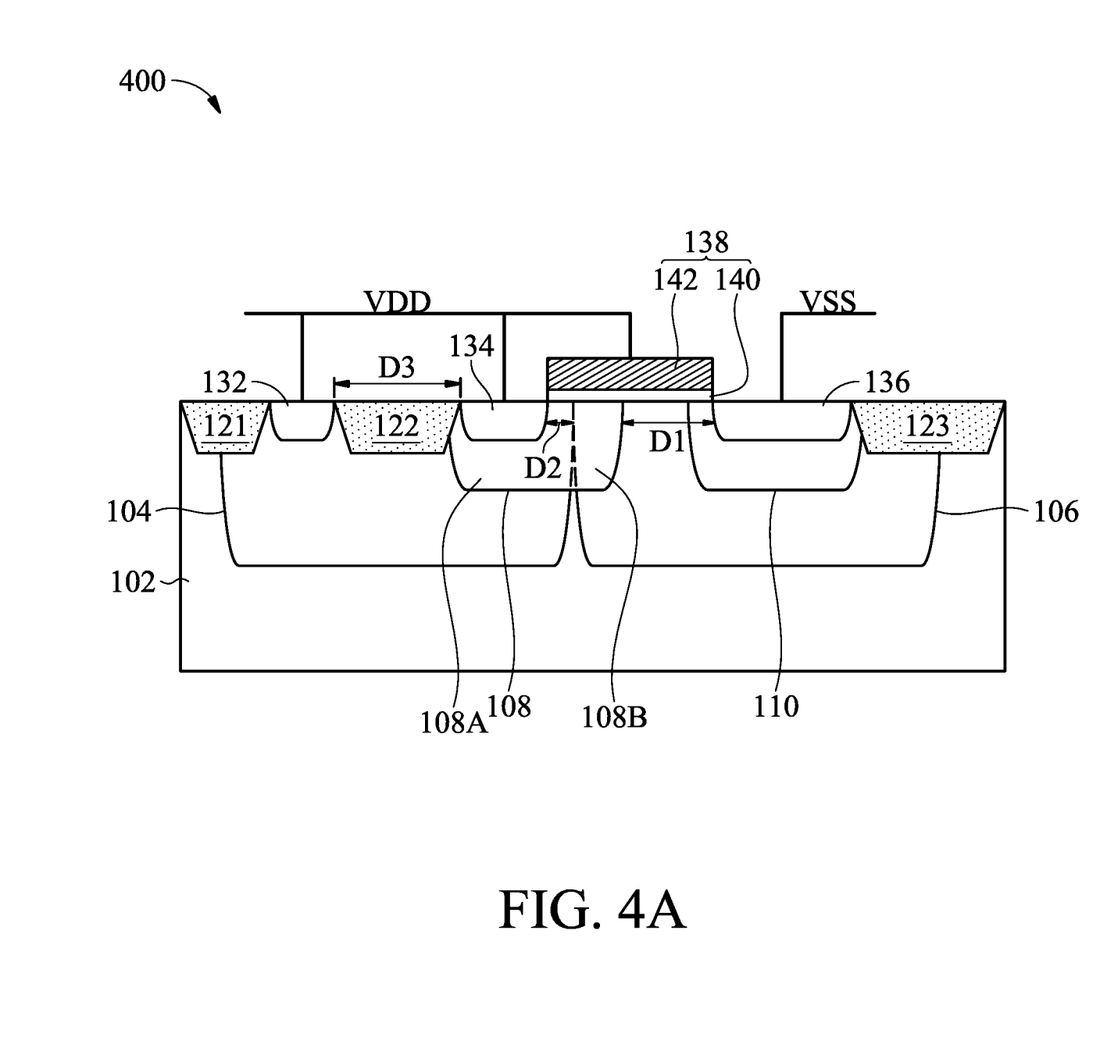
FIG. 4A illustrates a cross-sectional view of an electrostatic discharge protection device in accordance with some embodiments of the present disclosure.
Figure 4B:
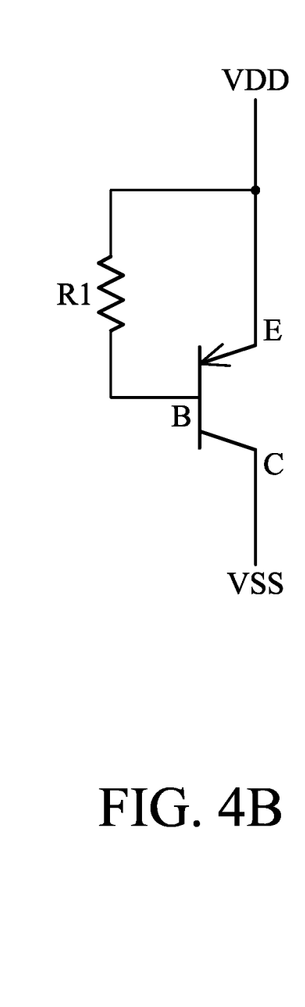
FIG. 4B illustrates an equivalent circuit diagram of the electrostatic discharge protection device of FIG. 4A.

FIG. 4A illustrates a cross-sectional view of an electrostatic discharge protection device 400 in accordance with some embodiments of the present disclosure, and FIG. 4B illustrates an equivalent circuit diagram of the electrostatic discharge protection device 400 of FIG. 4A. Elements or layers in FIGS. 4A and 4B that are the same or similar to those in FIGS. 3A and 3B are denoted by like reference numerals that have the same meaning, and the description thereof will not be repeated for the sake of brevity. The difference between the embodiments shown in FIGS. 4A-B and FIGS. 3A-B is that the electrostatic discharge protection device 400 includes an isolation feature 122 as shown in FIG. 2A.

Once the PN junction between the second well region 106 and the first doped region 108 is broken down at a low voltage to generate a reverse current, a potential difference ($V_{EB}$) exists between the emitter E (the second heavily doped region 134) and the base B (the first doped region 108). The larger resistance R1 results in the larger potential difference ($V_{EB}$) between the emitter E and the base B, which further increases the emitter current ($I_E$). As a result, the on-resistance of the electrostatic discharge protection device 400 can be reduced further by forming the isolation feature 122 so that the electrostatic current can be rapidly discharged to the ground line VSS through the electrostatic discharge protection device 400.

Figure 5A:
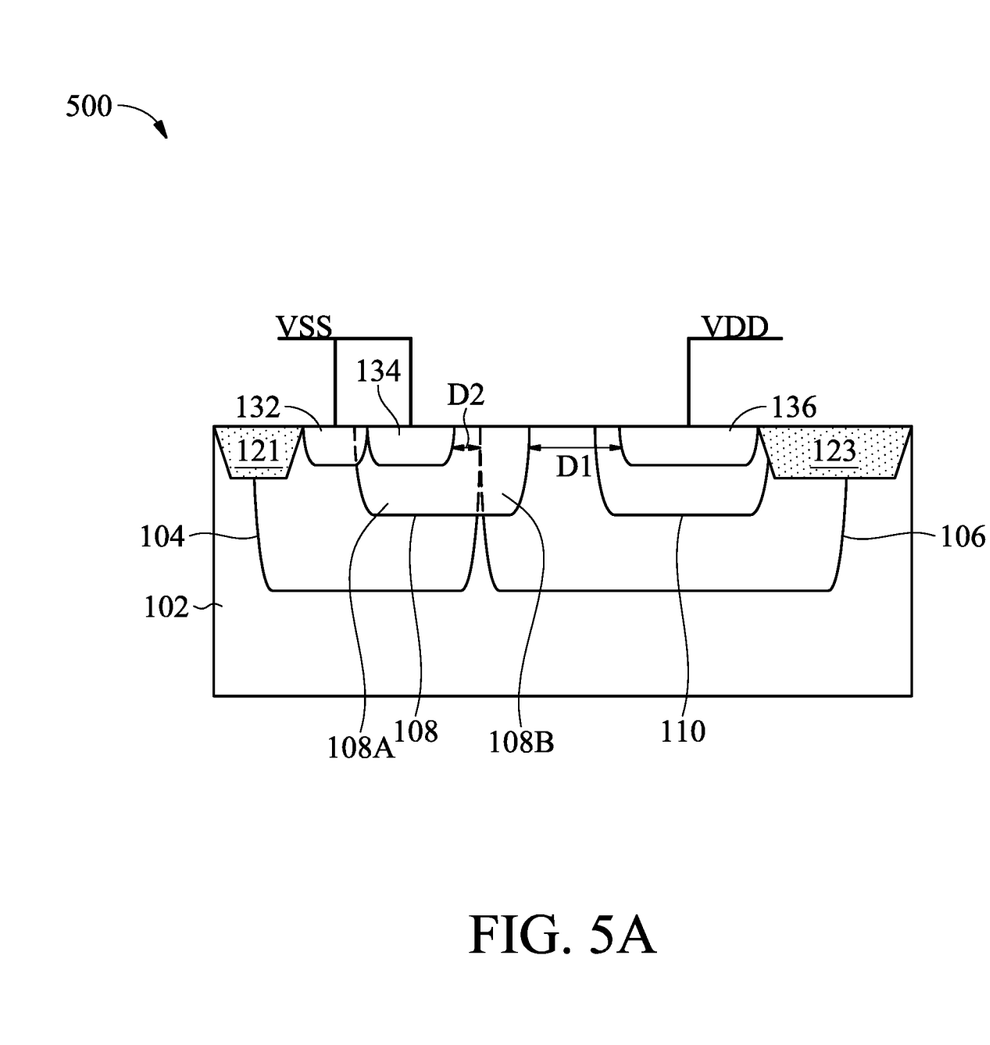
FIG. 5A illustrates a cross-sectional view of an electrostatic discharge protection device in accordance with some embodiments of the present disclosure.
Figure 5B:
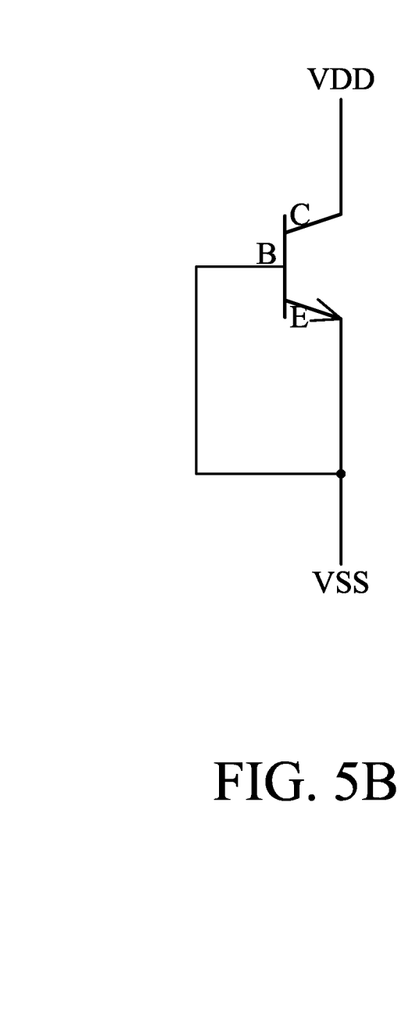
FIG. 5B illustrates an equivalent circuit diagram of the electrostatic discharge protection device of FIG. 5A.

FIG. 5A illustrates a cross-sectional view of an electrostatic discharge protection device 500 in accordance with some embodiments of the present disclosure, and FIG. 5B illustrates an equivalent circuit diagram of the electrostatic discharge protection device 400 of FIG. 5A. Elements or layers in FIGS. 5A and 5B that are the same or similar to those in FIGS. 1A and 1B are denoted by like reference numerals that have the same meaning, and the description thereof will not be repeated for the sake of brevity. The difference between the embodiments shown in FIGS. 5A-B and FIGS. 1A-B is that the first conductivity type is P-type and the second conductivity type is N-type.

The first heavily doped region 132 and the second heavily doped region 134 are together electrically connected to a ground line VSS, as shown in FIG. 5A, in accordance with some embodiments. The third heavily doped region 136 is electrically connected to a power line VDD, in accordance with some embodiments. The power line VDD and the ground line VSS respectively provide a high voltage and a low voltage to semiconductor devices that are protected by the electrostatic discharge protection device 500.

A PN junction exists between the second heavily doped region 134 and the first doped region 108, and a PN junction exists between the second well region 106 and the first doped region 108, as shown in FIGS. 5A and 5B, in accordance with some embodiments. As a result, the second heavily doped region 134, the first doped region 108, and the second well region 106 form a BJT. The BJT is an NPN-type BJT, in accordance with some embodiments. The third heavily doped region 136 is a collector C of the BJT, the first doped region 108 is a base B of the BJT, the second heavily doped region 134 is an emitter E of the BJT, in accordance with some embodiments.

The PN junction between the second well region 106 and the first doped region 108 has a breakdown voltage that is lower than an operation voltage of semiconductor devices protected by the electrostatic discharge protection device 500, in accordance with some embodiments. When an electrostatic discharge event occurs from the power line VDD, because the PN junction between the second well region 106 and the first doped region 108 is broken down at a low voltage, the electrostatic current is discharged through the BJT of the electrostatic discharge protection device 500 rather than through the semiconductor devices protected by the electrostatic discharge protection device 500. As a result, the electrostatic discharge protection device 500 protects the semiconductor devices from damage in the event of an electrostatic discharge.

Furthermore, once the PN junction between the second well region 106 and the first doped region 108 is broken down at a low voltage to generate a reverse current, a potential difference ($V_{EB}$) between the emitter E (the second heavily doped region 134) and the base B (the first doped region 108) generates a large amount of emitter current ($I_E$) that flows to collector C (the third heavily doped region 136), thereby reducing the on-resistance ($R_{ON}$) of the electrostatic discharge protection device 500. As a result, the electrostatic current can be rapidly discharged to the ground line VSS through the electrostatic discharge protection device 500.

Figure 6A:
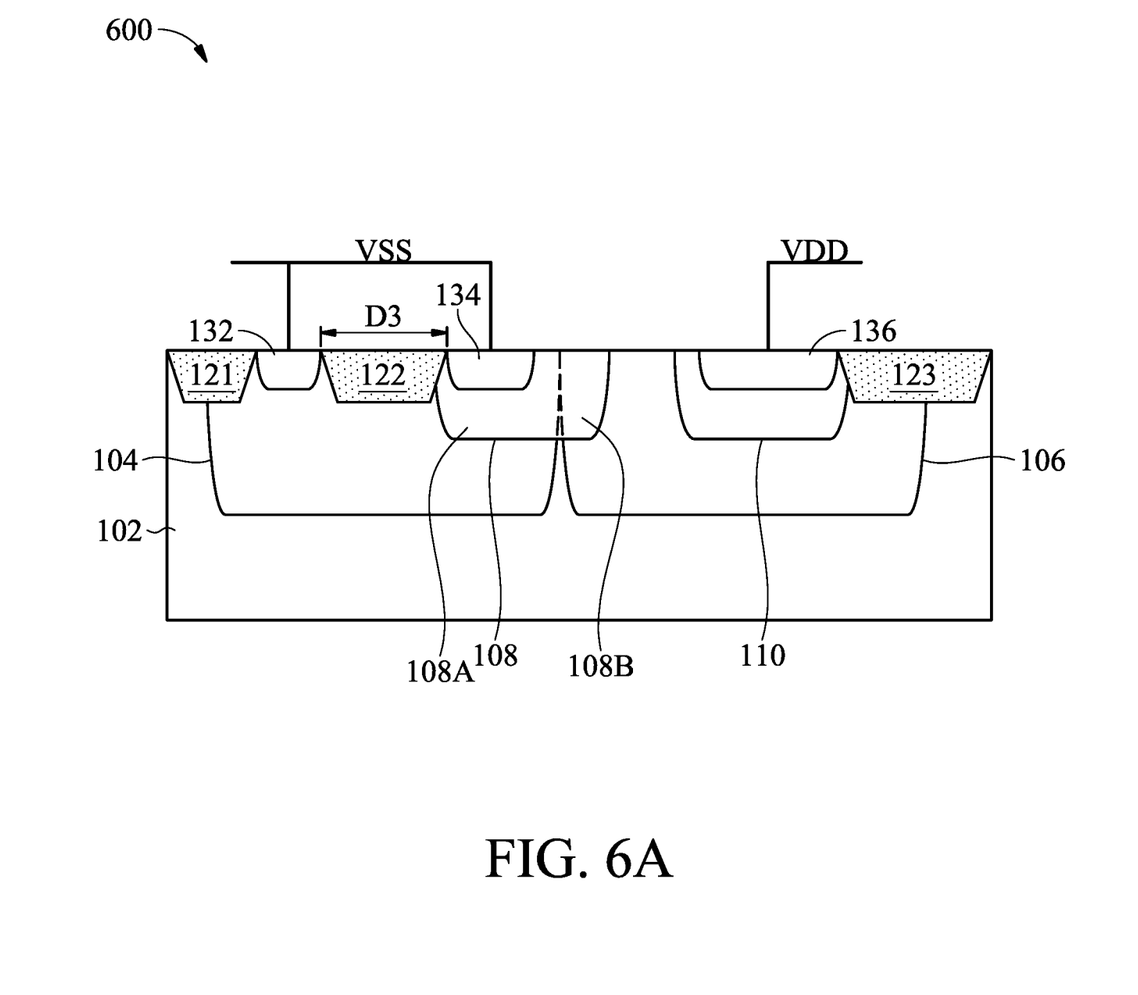
FIG. 6A illustrates a cross-sectional view of an electrostatic discharge protection device in accordance with some embodiments of the present disclosure.
Figure 6B:
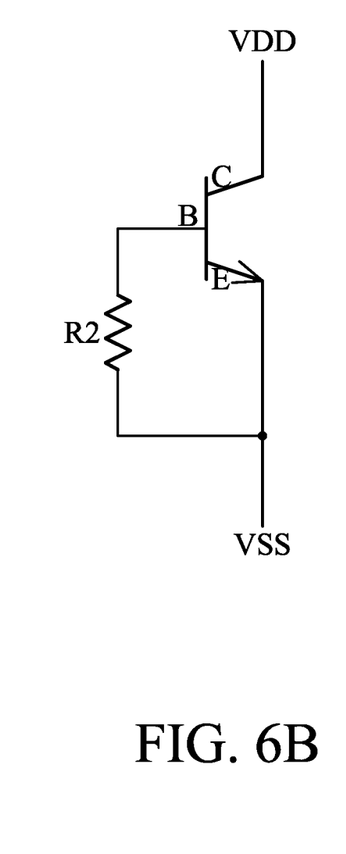
FIG. 6B illustrates an equivalent circuit diagram of the electrostatic discharge protection device of FIG. 6A.

FIG. 6A illustrates a cross-sectional view of an electrostatic discharge protection device 600 in accordance with some embodiments of the present disclosure, and FIG. 6B illustrates an equivalent circuit diagram of the electrostatic discharge protection device 600 of FIG. 6A. Elements or layers in FIGS. 6A and 6B that are the same or similar to those in FIGS. 5A and 5B are denoted by like reference numerals that have the same meaning, and the description thereof will not be repeated for the sake of brevity. The difference between the embodiments shown in FIGS. 6A-B and FIGS. 5A-B is that the electrostatic discharge protection device 600 includes an isolation feature 122 as shown in FIG. 2A.

The first well region 104 provides a resistance R2 between the first heavily doped region 132 and the first doped region 108 (the base B) by forming the isolation feature 122, as shown in FIGS. 6A and 6B, in accordance with some embodiments. The resistance R2 can be adjusted by changing the dimension D3 of the isolation feature 122. For example, the larger dimension D3 results in the larger resistance R2 and vice versa.

Once the PN junction between the second well region 106 and the first doped region 108 is broken down at a low voltage to generate a reverse current, a potential difference ($V_{EB}$) exists between the emitter E (the second heavily doped region 134) and the base B (the first doped region 108). The larger resistance R2 results in the larger potential difference ($V_{EB}$) between the emitter E and the base B, which further increases the emitter current ($I_E$). As a result, the on-resistance of the electrostatic discharge protection device 600 can be reduced further by forming the isolation feature 122 so that the electrostatic current can be rapidly discharged to the ground line VSS through the electrostatic discharge protection device 600.

Figure 7A:
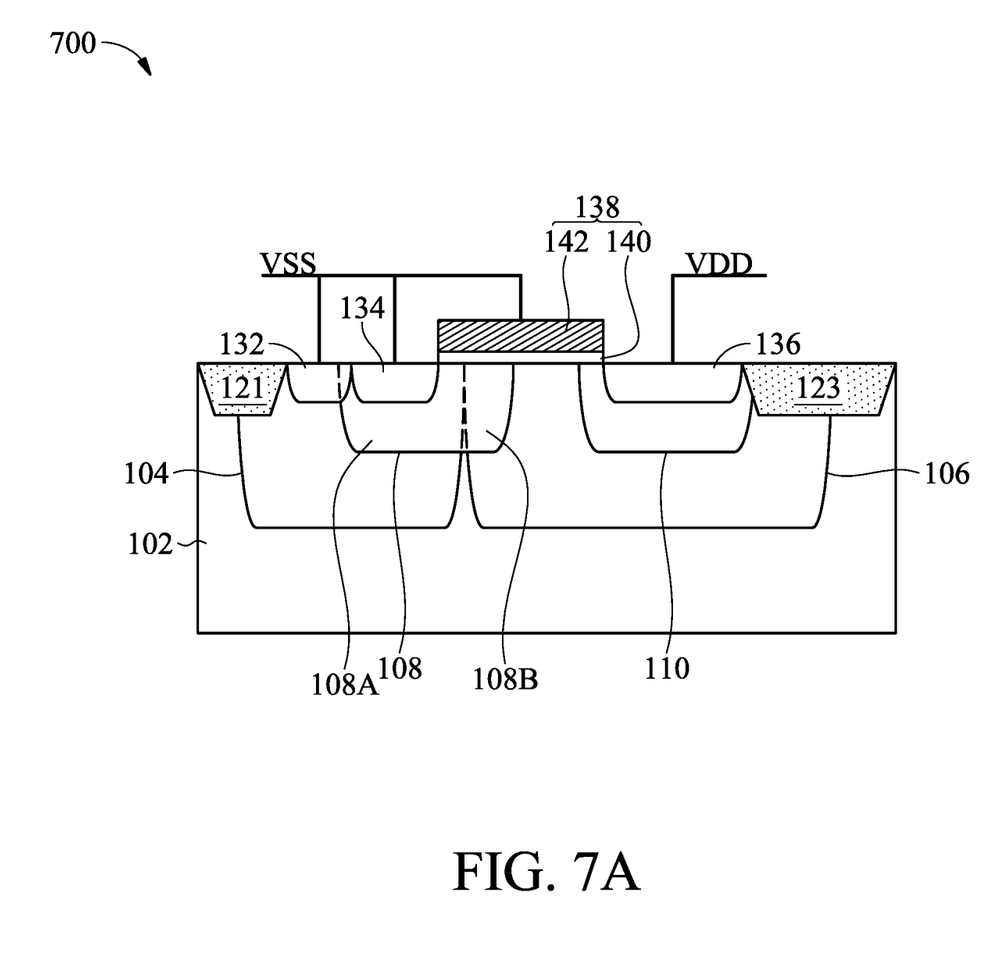
FIG. 7A illustrates a cross-sectional view of an electrostatic discharge protection device in accordance with some embodiments of the present disclosure.
Figure 7B:
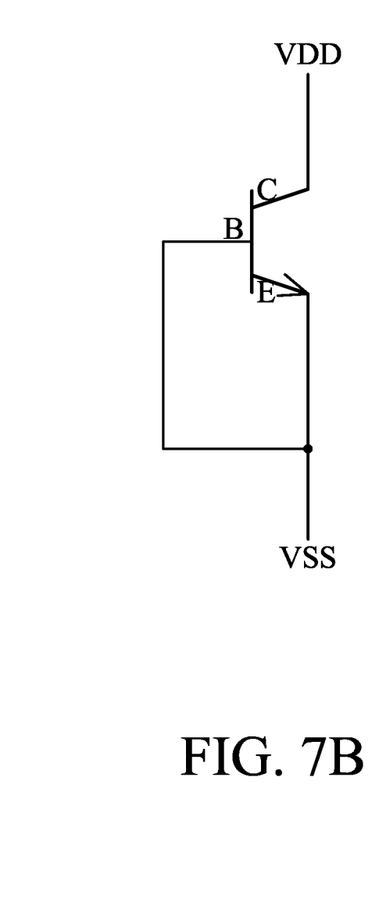
FIG. 7B illustrates an equivalent circuit diagram of the electrostatic discharge protection device of FIG. 7A.

FIG. 7A illustrates a cross-sectional view of an electrostatic discharge protection device 700 in accordance with some embodiments of the present disclosure, and FIG. 7B illustrates an equivalent circuit diagram of the electrostatic discharge protection device 700 of FIG. 7A. Elements or layers in FIGS. 7A and 7B that are the same or similar to those in FIGS. 5A and 5B are denoted by like reference numerals that have the same meaning, and the description thereof will not be repeated for the sake of brevity. The difference between the embodiments shown in FIGS. 7A-B and FIGS. 5A-B is that the electrostatic discharge protection device 700 includes a gate structure 138 as shown in FIG. 3A.

The first heavily doped region 132, the second heavily doped region 134 and the gate structure 138 are together electrically connected to the ground line VSS, and the third heavily doped region 136 is electrically connected to a power line VDD, in accordance with some embodiments.

When an electrostatic discharge event occurs from the power line VDD, the gate structure 138 electrically connected to the ground line VSS opens a channel region below the gate structure 138. As a result, the on-resistance of the electrostatic discharge protection device 700 can be reduced further by forming the gate structure 138 so that the electrostatic current can be rapidly discharged to the ground line VSS through the electrostatic discharge protection device 700.

Figure 8A:
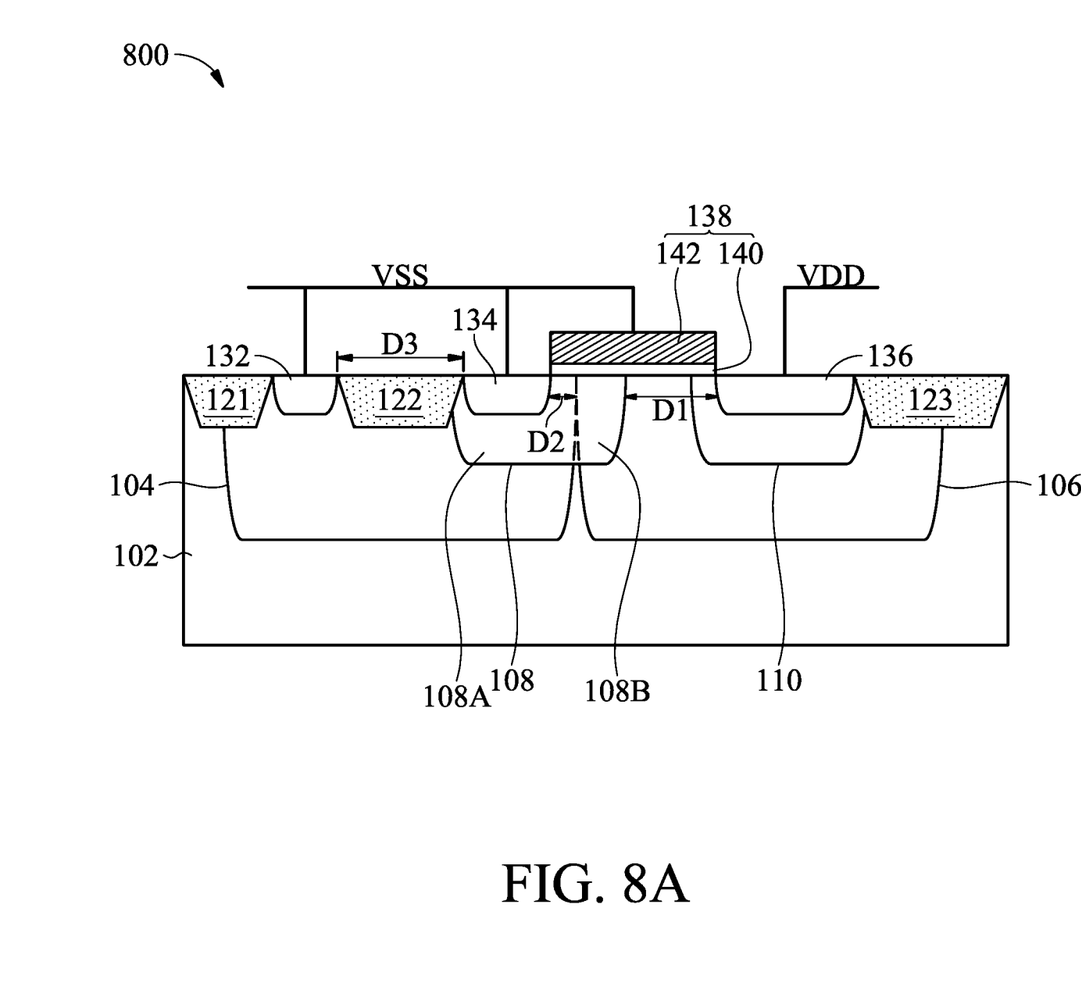
FIG. 8A illustrates a cross-sectional view of an electrostatic discharge protection device in accordance with some embodiments of the present disclosure.
Figure 8B:
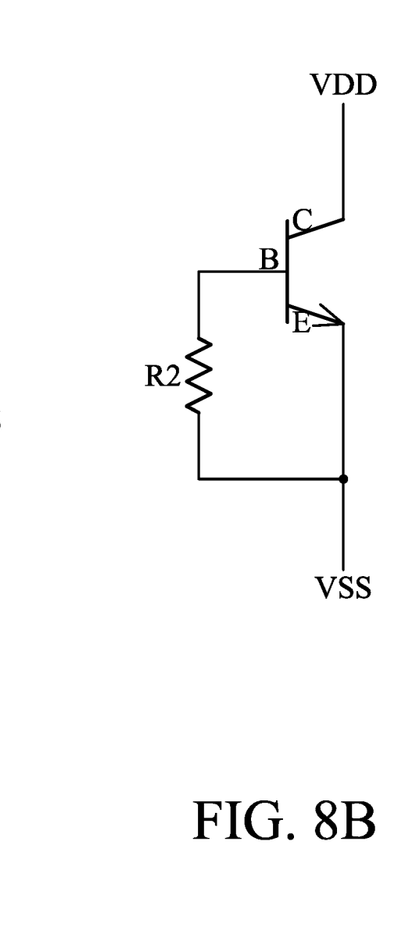
FIG. 8B illustrates an equivalent circuit diagram of the electrostatic discharge protection device of FIG. 8A.

FIG. 8A illustrates a cross-sectional view of an electrostatic discharge protection device 800 in accordance with some embodiments of the present disclosure, and FIG. 8B illustrates an equivalent circuit diagram of the electrostatic discharge protection device 800 of FIG. 8A. Elements or layers in FIGS. 8A and 8B that are the same or similar to those in FIGS. 7A and 7B are denoted by like reference numerals that have the same meaning, and the description thereof will not be repeated for the sake of brevity. The difference between the embodiments shown in FIGS. 8A-B and FIGS. 7A-B is that the electrostatic discharge protection device 800 includes an isolation feature 122 as shown in FIG. 6A.

Once the PN junction between the second well region 106 and the first doped region 108 is broken down at a low voltage to generate a reverse current, a potential difference ($V_{EB}$) exists between the emitter E (the second heavily doped region 134) and the base B (the first doped region 108). The larger resistance R1 results in the larger potential difference ($V_{EB}$) between the emitter E and the base B, which further increases the emitter current ($I_E$). As a result, the on-resistance of the electrostatic discharge protection device 800 can be reduced further by forming the isolation feature 122 so that the electrostatic current can be rapidly discharged to the ground line VSS through the electrostatic discharge protection device 800.

In summary, the embodiments of the present disclosure provide an electrostatic discharge protection device. The electrostatic discharge protection device includes a BJT which is formed from a heavily doped region, a moderately doped region, and a lightly doped well region. When an electrostatic discharge event occurs, the PN junction between the well region and the moderately doped region is broken down at a low voltage to generate a reverse current so that the electrostatic current is discharged through the BJT of the electrostatic discharge protection device without through the semiconductor devices protected by the electrostatic discharge protection device. Therefore, the electrostatic discharge protection device protects the semiconductor devices from damage in the event of an electrostatic discharge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge protection device, comprising:
    a first well region and a second well region disposed in a semiconductor substrate, wherein the first well region has a first conductivity type and the second well region has a second conductivity type that is the opposite of the first conductivity type;
    a first doped region disposed in the first well region and the second well region, wherein the first doped region has the first conductivity type;
    a first heavily doped region disposed in the first doped region in the first well region, wherein the first heavily doped region has the second conductivity type; and
    a second heavily doped region disposed in the first well region, wherein the second heavily doped region has the first conductivity type, and the second heavily doped region is completely outside the first doped region.

2. The electrostatic discharge protection device as claimed in claim 1, wherein a doping concentration of the first doped region is greater than a doping concentration of the first well region and less than a doping concentration of the first heavily doped region.

3. The electrostatic discharge protection device as claimed in claim 1, wherein doping concentration of the first doped region is greater than a doping concentration of the second well region.

4. The electrostatic discharge protection device as claimed in claim 1, wherein the first heavily doped region and the second heavily doped region are together electrically connected to a power line (VDD) or a ground line (VSS).

5. The electrostatic discharge protection device as claimed in claim 1, further comprising:
    an isolation feature disposed between the first heavily doped region and the second heavily doped region.

6. The electrostatic discharge protection device as claimed in claim 1, wherein the first heavily doped region is in contact with the second heavily doped region.

7. The electrostatic discharge protection device as claimed in claim 1, further comprising:
    a second heavily doped region disposed in the second well region, wherein the second heavily doped region has the second conductivity type.

8. The electrostatic discharge protection device as claimed in claim 7, wherein the first heavily doped region is electrically connected to a power line (VDD) or a ground line (VSS), and the second heavily doped region is electrically connected to the other of the power line (VDD) or the ground line (VSS).

9. The electrostatic discharge protection device as claimed in claim 7, further comprising:
    a second doped region disposed in the second well region, wherein the second doped region has the second conductivity type, and the second heavily doped region is disposed in the second doped region.

10. The electrostatic discharge protection device as claimed in claim 9, wherein a doping concentration of the second doped region is greater than a doping concentration of the second well region and less than a doping concentration of the second heavily doped region.

11. The electrostatic discharge protection device as claimed in claim 1 wherein the first conductivity type is N-type and the second conductivity type is P-type.

12. The electrostatic discharge protection device as claimed in claim 1 wherein the first conductivity type is P-type and the second conductivity type is N-type.

13. An electrostatic discharge protection device, comprising:
   a first well region disposed in a semiconductor substrate;
   a first doped region including a first portion in the first well region and a second portion outside the first well region;
   a first heavily doped region disposed in the second portion of the first doped region;
   a second heavily doped region disposed in the first well region;
   a second well region having a first conductivity type, wherein the second portion of the first doped region is disposed in the second well region; and
   a third heavily doped region disposed in the second well region, wherein the third heavily doped region has the first conductivity type, and the third heavily doped region is completely outside the first doped region,
   wherein the first doped region has the first conductivity type, and the first well region, the first heavily doped region, and the second heavily doped region have a second conductivity type that is the opposite of the first conductivity type.

14. The electrostatic discharge protection device as claimed in claim 13, further comprising:
   a gate structure partially covering the first doped region and the first well region.

15. The electrostatic discharge protection device as claimed in claim 14, wherein the gate structure is disposed between the first heavily doped region and the second heavily doped region.

16. The electrostatic discharge protection device as claimed in claim 14, wherein the gate structure and the first heavily doped region are together electrically connected to a power line (VDD) or a ground line (VSS), and the second heavily doped region is electrically connected to the other of the power line (VDD) or the ground line (VSS).

17. The electrostatic discharge protection device as claimed in claim 13, wherein the first well region, the first doped region, and the first heavily doped region form a bipolar junction transistor (BJT).

18. The electrostatic discharge protection device as claimed in claim 17, wherein the first heavily doped region is an emitter of the BJT, the first doped region is a base of the BJT, and the second heavily doped region is a collector of the BJT.

* * * * *